United States Patent
Lin et al.

(10) Patent No.: US 10,470,291 B2
(45) Date of Patent: Nov. 5, 2019

(54) PROCESS FOR PREPARING AN ENERGY SAVING ANTI-BURST HEAT DISSIPATION DEVICE

(71) Applicants: Chintung Lin, Xinbei (TW); Aolong Yang, Xinbei (TW)

(72) Inventors: Chintung Lin, Xinbei (TW); Aolong Yang, Xinbei (TW)

(73) Assignee: Chintung Lin, Xinbei (TW)

( * ) Notice: Subject to any disclaimer, the term of this patent is extended or adjusted under 35 U.S.C. 154(b) by 0 days.

(21) Appl. No.: 15/832,046

(22) Filed: Dec. 5, 2017

(65) Prior Publication Data

US 2019/0029106 A1    Jan. 24, 2019

(30) Foreign Application Priority Data

Jul. 21, 2017 (CN) .......................... 2017 1 0598310
Jul. 21, 2017 (CN) .......................... 2017 2 0888046

(51) Int. Cl.
| | |
|---|---|
| *H05K 1/02* | (2006.01) |
| *C22C 9/00* | (2006.01) |
| *C25D 5/00* | (2006.01) |
| *H01L 23/373* | (2006.01) |
| *H01L 23/427* | (2006.01) |
| *H01L 21/48* | (2006.01) |
| *F28F 13/18* | (2006.01) |
| *F28F 21/08* | (2006.01) |
| *F28D 15/04* | (2006.01) |
| *H05K 3/10* | (2006.01) |
| *H05K 3/24* | (2006.01) |

(Continued)

(52) U.S. Cl.
CPC ............. *H05K 1/0209* (2013.01); *C22C 9/00* (2013.01); *C25D 5/00* (2013.01); *F28D 15/046* (2013.01); *F28F 13/187* (2013.01); *F28F 21/08* (2013.01); *F28F 21/089* (2013.01); *H01L 21/4882* (2013.01); *H01L 23/3736* (2013.01); *H01L 23/427* (2013.01); *B23P 15/26* (2013.01); *F28D 15/0283* (2013.01); *F28D 15/04* (2013.01); *F28F 2245/00* (2013.01); *H05K 3/102* (2013.01); *H05K 3/246* (2013.01); *H05K 2201/064* (2013.01); *Y10T 29/49353* (2015.01)

(58) Field of Classification Search
CPC ........... Y10T 29/49353; F28D 15/0283; F28D 15/046; F28D 15/26; B23P 15/26
See application file for complete search history.

(56) References Cited

U.S. PATENT DOCUMENTS 2,469,975 A * 5/1949 McCloy .................... B65B 9/12
                                                    219/91.23
3,769,674 A * 11/1973 Droughton ............. B21D 53/06
                                                    29/890.032

(Continued)

*Primary Examiner* — Jason L Vaughan (57) ABSTRACT

A preparation process of a copper powder metal plating layer, a metal substrate having the copper powder metal plating layer, an energy-saving anti-burst heat dissipation device and a preparation process thereof; the process of preparing the copper powder metal plating layer comprises the step of attaching the metal layer; the temperature of the liquid in the work tank is kept within a range of 1-15° C.; the attachment process of the metal layer comprises at least the steps of: attaching the bottom layer, attaching the snowflake-shaped layer and attaching the fastening layer.

3 Claims, 4 Drawing Sheets

(51) Int. Cl.
    *F28D 15/02*    (2006.01)
    *B23P 15/26*    (2006.01)

(56) References Cited

U.S. PATENT DOCUMENTS

| | | | | |
|---|---|---|---|---|
| 5,029,389 | A * | 7/1991 | Tanzer | F28D 15/0233 165/104.21 |
| 6,230,407 | B1 * | 5/2001 | Akutsu | F28D 15/0233 29/890.032 |
| 7,404,255 | B2 * | 7/2008 | Li | B01D 5/0093 165/104.18 |
| 7,430,803 | B2 * | 10/2008 | Li | F25B 23/006 165/104.18 |
| 9,835,383 | B1 * | 12/2017 | Roper | F28D 15/04 |
| 2003/0173064 | A1 * | 9/2003 | Ueki | F28D 15/0233 165/104.21 |
| 2004/0111887 | A1 * | 6/2004 | Hsu | B23P 15/26 29/890.032 |
| 2005/0022414 | A1 * | 2/2005 | Hsu | F28D 15/0283 34/92 |
| 2006/0005952 | A1 * | 1/2006 | Yeh | B23P 15/26 165/104.26 |
| 2006/0117557 | A1 * | 6/2006 | Li | F28D 15/0283 29/726 |
| 2006/0213647 | A1 * | 9/2006 | Lin | B23P 15/26 165/104.26 |
| 2007/0062038 | A1 * | 3/2007 | Hou | B23P 15/26 29/890.032 |
| 2007/0074395 | A1 * | 4/2007 | Hou | B23P 15/26 29/890.032 |
| 2007/0261243 | A1 * | 11/2007 | Yang | B23K 1/015 29/890.03 |
| 2010/0077615 | A1 * | 4/2010 | Hou | B23P 15/26 29/890.039 |
| 2010/0200199 | A1 * | 8/2010 | Habib | C25D 7/00 165/104.26 |
| 2011/0083829 | A1 * | 4/2011 | Hung | F28D 15/0233 165/104.26 |
| 2011/0174474 | A1 * | 7/2011 | Liu | C23C 28/30 165/185 |
| 2011/0203777 | A1 * | 8/2011 | Zhao | F28D 15/046 165/104.26 |
| 2011/0240264 | A1 * | 10/2011 | Wang | B23P 15/26 165/104.26 |
| 2012/0080170 | A1 * | 4/2012 | Yang | F28D 15/0233 165/104.26 |
| 2016/0193702 | A1 * | 7/2016 | Yang | B23P 15/26 29/890.054 |
| 2016/0221131 | A1 * | 8/2016 | Shen | B23P 15/26 |
| 2016/0288276 | A1 * | 10/2016 | Chen | B23P 15/26 |
| 2016/0377353 | A1 * | 12/2016 | Bozorgi | F28D 15/0283 165/104.21 |
| 2017/0248378 | A1 * | 8/2017 | Aoki | F28F 1/04 |

\* cited by examiner

PROCESS FOR PREPARING AN ENERGY SAVING ANTI-BURST HEAT DISSIPATION DEVICE

TECHNICAL FIELD OF THE INVENTION

The present invention relates to the technical field of heat dissipation devices, and more particularly, to a preparation process of a copper powder metal plating layer, a metal substrate having the copper powder metal plating layer, an energy-saving anti-burst heat dissipation device and a preparation process thereof.

BACKGROUND OF THE INVENTION

As the market requires higher integration and higher speed of electronic products, heat dissipation performance plays a key role for guaranteeing product quality. In the prior art, a traditional heat dissipation device usually dissipates heat through heat dissipation fins. To improve the heat dissipation efficiency, a cooling fan is added to the heat dissipation device for enhancing air mobility. However, such a method fails to achieve a fast cooling. Therefore, how to absorb and transfer heat in a short time is an urgent problem that needs to be solved for those skilled in the art.

Although the capillary action of condensation pipes can be utilized for dissipating heat, related technologies remain in the experimental stage and cannot be used for industrial purposes. The technical core is the preparation of a metal plating layer that possesses a greater capillary force and a higher evaporation speed while protecting the rigidity of the metal substrate. However, it's very difficult to achieve a metal plating layer having a thickness less than 1 mm. In the prior art, the thickness of the thinnest mobile heat tube merely reaches 0.6 mm.

SUMMARY OF THE INVENTION

One purpose of the present invention is to solve the shortcomings in the prior art and provide a preparation process of a copper powder metal plating layer, which completely overturns the traditional preparation process of vapor chambers. The copper powder metal plating layer prepared by the process of the present invention is in a snowflake shape or a coral shape, which has a larger surface area, a higher evaporation speed, a greater capillary force and a thinner thickness. The thickness of the copper powder metal plating layer of the present invention can reach 0.1 mm, achieving a firm attachment between the copper powder metal plating layer and the metal substrate. Meanwhile, as the traditional high-temperature sintering step can be saved, the rigidity of the metal substrate can be perfectly maintained. Thus, the hardness of the metal substrate can be ensured. Furthermore, the present invention adopts a laser/friction soldering method to replace the traditional solder-paste high-temperature soldering method, which is time-saving, energy-efficient and eco-friendly.

To achieve the above purpose, the present invention adopts the following technical solution:

A process for preparing a copper powder metal plating layer, comprising the steps of:

Step 1: washing the metal substrate;

Step 2: wrapping the metal substrate except for the working surface of the metal substrate that needs to be attached with a metal layer;

Step 3: attaching the metal layer to the metal substrate;

The metal substrate having an exposed working surface is immersed into a work tank via an appropriate jig; during the attachment process, the temperature of the liquid in the work tank is kept within a range of 1-15° C., thereby forming the copper powder into snowflake-shape or coral-shape; a high temperature can lead to a high activity of copper ions, resulting in a difficult attachment process; meanwhile, the copper powder can be over-burnt, blackened and oxidized under a large current; the composition proportion of the liquid in the work tank is as follows: the concentration of sulfuric acid is 70-85 g/l, the concentration of copper sulfate is 250-260 g/l, and the solvent is purified water;

The process of attaching the metal layer comprises at least the steps of:

a) Attaching a bottom layer, wherein the size of metal particles in the bottom layer is 0.1-1 nm, and the thickness of the bottom layer is 0.01-0.05 mm; the bottom layer is attached to the working surface of the metal substrate;

b) Attaching a snowflake-shaped metal layer, wherein the size of the metal particles in the snowflake-shaped metal layer is 1.5-10 nm, and the thickness of the snowflake-shaped metal layer is 0.1-2 mm;

c) Attaching a fastening layer, wherein the size of the metal particles in the fastening layer is 0.5-1.5 nm, and the thickness of the fastening layer is 1-5 nm;

Step 4: washing the metal substrate that is attached with a metal layer;

Step 5: absorbing the liquid left on the metal substrate that is washed in step 4; subsequently, drying the metal substrate, thereby obtaining the copper powder metal plating layer having a liquid-absorbing capillary force.

In another preferred embodiment, during the process for preparing the copper powder metal plating layer, the current in the process of attaching the bottom layer is controlled within the range of 0.8-1.1 A, and the attachment time is 10-15 minutes;

The current in the process of attaching the snowflake-shaped metal layer is controlled within the range of 1.5-8.0 A, and the attachment time is 2-10 minutes;

According to the area of the surface, the current in the process of attaching the fastening layer is controlled within the range of 0.3-1.0 A, and the attachment time is 1-2 hours.

In another preferred embodiment, the bottom layer, the snowflake-shaped metal layer and the fastening layer are respectively to be a single-layered structure or a multi-layered structure.

In another preferred embodiment, the process of attaching the snowflake-shaped metal layer, comprising the step of:

Controlling the current at 1.5 A; after attaching for 2 minutes, obtaining the snowflake-shaped metal layer having a thickness of 0.1 mm; alternatively, regulating the current to be 2.5 A; after attaching for 2 minutes, obtaining the snowflake-shaped metal layer having a thickness of 0.15-0.2 mm; alternatively, regulating the current to be 3.0 A; after attaching for 2.5 minutes, obtaining the snowflake-shaped metal layer having a thickness of 0.25-0.3 mm; alternatively, regulating the current to be 4.0 A; after attaching for 3 minutes, obtaining the snowflake-shaped metal layer having a thickness of 0.35 mm; alternatively, regulating the current to be 4.5-5.0 A; after attaching for 3 minutes, obtaining the snowflake-shaped metal layer having a thickness of 0.4 mm; alternatively, regulating the current to be 5.5 A; after attaching for 4 minutes, obtaining the snowflake-shaped metal layer having a thickness of 0.5 mm; alternatively, regulating the current to be 6 A; after attaching for 5 minutes, obtaining the snowflake-shaped metal layer having a thickness of 0.6 mm; alternatively, regulating the current to be 6.5 A; after attaching for 5 minutes, obtaining the snowflake-shaped metal layer having a thickness of 0.7-0.8 mm; alternatively, regulating the current to be 7.0 A; after attaching for 6 minutes, obtaining the snowflake-shaped metal layer having a thickness of 0.9 mm; alternatively, regulating the current to be 8.0 A; after attaching for 6 minutes, obtaining the snowflake-shaped metal layer having a thickness of 1 mm.

In another preferred embodiment, step 1 specifically comprises the steps of: washing the metal substrate by dilute sulfuric acid having a concentration of 5%-15% for 4-5 minutes; subsequently, washing the metal substrate by purified water for at least three times, thereby thoroughly cleaning the surface of the metal substrate;

Step 4 specifically comprises the steps of: placing the metal substrate into a washing tank containing 5 wt % of sodium carbonate; subsequently, heating the liquid in the washing tank to a temperature of 40-60° C. via ultrasonic wave, washing for 10-15 minutes, and then washing the metal substrate by clean water for two to three times;

Step 5 specifically comprises the steps of: absorbing the residual water in the metal layer of the cleaned metal substrate by absorbent paper; subsequently, placing the metal substrate into a nitrogen protection box for a drying process, thereby obtaining the copper powder metal plating layer having a water-absorbing capillary force, and preventing the metal plating layer from being oxidized.

The preparation process of the metal powder metal plating layer of the present invention can be completed within three hours, which is efficient and eco-friendly. The copper powder metal plating layer prepared by the process of the present invention is in a snowflake shape or a coral shape, which has a larger surface area, a higher evaporation speed, a greater capillary force and a thinner thickness. The thickness of the copper powder metal plating layer of the present invention can reach 0.1 mm. Additionally, it's unnecessary to perform a traditional high-temperature sintering step. Therefore, the rigidity of the metal substrate can be maintained perfectly, effectively protecting the hardness of the metal substrate from being damaged.

The other purpose of the present invention is to provide a metal substrate having the copper powder metal plating layer, which can be prepared according to the above preparation process. The prepared copper powder metal plating layer of the metal substrate has ideal attachment force, capillary force and evaporation performance. Meanwhile, the prepared metal substrate has a high anti-burst performance.

A process for preparing the energy-saving anti-burst heat dissipation device, comprising the steps of:

Step 1: respectively electroplating the copper powder metal plating layer onto an upper metal substrate and a lower metal substrate according to the preparation process of claims 1-7;

Step 2: seal-soldering the periphery of the upper metal substrate and the lower metal substrate that are electroplated with the copper powder metal plating layer via a laser soldering method, thereby forming a sealed chamber;

Step 3: utilizing a high-frequency soldering degasser to obtain the vapor chamber, and feeding refrigerant into the vapor chamber through the degasser;

Step 4: vacuuming the chamber for the first time, thereby enabling the air pressure in the chamber to reach $6.0^{-1}$ to $8.0^{-2}$ Pa;

Step 5: degassing for the second time, and heating the vacuumed vapor chamber to a temperature of 100-150° C., thereby forcing the residual gas in step 4 to be concentrated at the top of the degasser; subsequently, cutting-off the degasser from the tail end;

Step 6: seal-soldering the cut;

Step 7: shaping and trimming, thereby obtaining a finished heat dissipation device.

In another preferred embodiment, at least one of the upper metal substrate and the lower metal substrate is provided with a plurality of column bodies, and the plurality of column bodies is soldered to the metal substrate; at least one of the upper metal substrate and the lower metal substrate is provided with a plurality of supporting ribs, and the plurality of supporting ribs is molded in one body with the metal substrate; the exposed surfaces of the column bodies and that of the supporting ribs are attached with the copper powder metal plating layer, which functions as a refrigerant conductor; when the upper metal substrate and the lower metal substrate interact with each other, the end portion of the column bodies that are disposed on one metal substrate abut against the other metal substrate, and the supporting ribs that are disposed on one metal substrate abut against the other metal substrate. Such a configuration can facilitate the heat conversion of the refrigerant between the upper metal substrate and the lower metal substrate. Thus, the cooling speed can be increased.

In another preferred embodiment, the metal substrate can be a copper substrate, an aluminum substrate, a zinc substrate, a tin substrate, a titanium substrate or a stainless-steel substrate; the plurality of column bodies is soldered to the metal substrate via a laser soldering method or a friction soldering method;

Step 5 specifically comprises the steps of: heating the vacuumed vapor chamber to a temperature of 120° C., thereby forcing the residual gas in step 4 to be concentrated at the top of the degasser;

Step 6 specifically comprises the step of: seal-soldering the cut via a laser soldering method;

Step 7 specifically comprises the steps of: trimming and grinding, thereby obtaining a finished heat dissipation device.

The present invention also provides an energy-saving anti-burst heat dissipation device, which can be prepared according to the above process. The energy-saving anti-burst heat dissipation device of the present invention is provided with an upper metal substrate and a lower metal substrate, wherein the upper metal substrate and the lower metal substrate are seal-soldered to form a chamber, and the chamber is filled with the refrigerant;

The upper metal substrate and the lower metal substrate are respectively provided with a plurality of supporting ribs. At least one of the upper metal substrate and the lower metal substrate is provided with a plurality of column bodies that are fixed to the metal substrate;

The inner surface of at least one of the upper metal substrate and the lower metal substrate is attached with the copper powder metal plating layer;

The copper powder metal plating layer comprises at least a bottom layer that is attached to the inner surface of the upper metal substrate or the lower metal substrate, a snowflake-shaped metal layer that is attached on the bottom layer and a fastening layer that is attached on the snowflake-shaped metal layer;

The size of the metal particles in the bottom layer is 0.1-1 nm, and the thickness of the bottom layer is 0.01-0.05 mm;

The size of the metal particles in the snowflake-shaped metal layer is 1.5-10 nm, and the thickness of the snowflake-shaped metal layer is 0.1-2 mm;

The size of the metal particles in the fastening layer is 0.5-1.5 nm, and the thickness of the fastening layer is 1-5 nm.

In another preferred embodiment, the copper powder metal plating layer of the energy-saving anti-burst heat dissipation device further comprises a reinforcement layer. The reinforcement layer is attached on the fastening layer. The size of the metal particles in the reinforcement layer is 0.5-2.0 nm, and the thickness of the fastening layer is 1-5 nm.

In another preferred embodiment, the copper powder metal plating layer of the energy-saving anti-burst heat dissipation device further comprises a locking layer. The locking layer is attached on the reinforcement layer. The size of the metal particles in the locking layer is 0.8-1.5 nm, and the thickness of the fastening layer is 1-5 nm.

In another preferred embodiment, the supporting ribs are compression-molded grooves, and the convex side of the grooves corresponds to the inner surfaces of the upper substrate and the lower substrate.

In another preferred embodiment, the convex side of the grooves is attached with a copper powder metal plating layer.

In another preferred embodiment, the supporting ribs of the upper substrate and the lower substrate are disposed in a staggered manner.

In another preferred embodiment, the inner surface of the upper substrate is soldered with one ends of the column bodies, and the other ends of the column bodies that are soldered to the upper substrate abut against the inner surface of the lower substrate; each surface of the column bodies that are soldered to the upper substrate is attached with a copper powder metal plating layer; the inner surface of the lower substrate is soldered with one ends of the column bodies, and the other ends of the column bodies that are soldered to the lower substrate abut against the inner surface of the upper substrate; each surface of the column bodies that are soldered to the lower substrate is attached with a copper powder metal plating layer.

In another preferred embodiment, the column bodies that are disposed on the upper substrate are arranged in a matrix, and the column bodies that are disposed on the lower substrate are arranged in a matrix.

In another preferred embodiment, the column bodies that are disposed on the upper substrate are arranged in a linear matrix, and the column bodies that are disposed on the lower substrate are arranged in a linear matrix.

Compared with the prior art, the present invention has the following advantages:

The process for preparing the copper powder metal plating layer of the present invention is energy-efficient and eco-friendly. The prepared copper powder metal plating layer of the present invention can be firmly attached to the metal substrate, and possesses a greater capillary force and a higher evaporation performance. Meanwhile, as the preparation process of the present invention adopts DC current, the rigidity of the metal substrate can be protected from being damaged. Thus, the hardness of the metal substrate can be perfectly kept. The prepared energy-saving anti-burst heat dissipation device achieves ideal heat conduction, heat dissipation and anti-burst performance. Furthermore, the thickness of the heat dissipation device of the present invention can achieve 0.3 mm, which breaks the technical bottleneck of 0.6 mm in the prior art.

BRIEF DESCRIPTION OF THE DRAWINGS

To clearly expound the technical solution of the present invention, the drawings and embodiments are hereinafter combined to illustrate the present invention. Obviously, the drawings are merely some embodiments of the present invention and those skilled in the art can associate themselves with other drawings without paying creative labor.

MARKING INSTRUCTIONS OF THE DRAWINGS

Upper Substrate 100, Lower Substrate 200, Column Body 300, Supporting Rib 400, Copper Powder Metal Plating Layer 500, Degasser 600

DETAILED DESCRIPTION OF THE INVENTION

Drawings and detailed embodiments are combined hereinafter to elaborate the technical principles of the present invention.

Embodiment 1

A process for preparing the copper powder metal plating layer, comprising the steps of:

Step 1: washing the metal substrate: washing the metal substrate by dilute sulfuric acid having a concentration of 5%-15% for 4-5 minutes; subsequently, washing the metal substrate by purified water for at least three times, thereby thoroughly cleaning the surface of the metal substrate, wherein the metal substrate can be a copper substrate, an aluminum substrate, a zinc substrate, a tin substrate, a titanium substrate or a stainless-steel substrate;

Step 2: wrapping the metal substrate except for the working surface of the metal substrate that needs to be attached with a metal layer;

Step 3: attaching the metal layer to the metal substrate;

The metal substrate having an exposed working surface is immersed into a work tank via an appropriate jig; during the attachment process, the temperature of the liquid in the work tank is kept within a range of 1-10° C., thereby making the copper powder be snowflake-shaped or coral-shaped; the temperature of the liquid directly determines the electroplating effect; a high temperature can lead to a high activity of copper ions, resulting in a difficult attachment process; meanwhile, the copper powder can be over-burnt, blackened and oxidized under a large current; the composition proportion of the liquid in the working tank is as follows: the concentration of sulfuric acid is 70-85 g/l, the concentration of copper sulfate is 250-260 g/l, and the solvent is purified water;

The process of attaching the metal layer comprises at least the steps of:
a) Attaching a bottom layer, wherein the size of metal particles in the bottom layer is 0.1-1 nm, and the thickness of the bottom layer is 0.01-0.05 mm; the bottom layer is attached to the working surface of the metal substrate;
b) Attaching a snowflake-shaped metal layer, wherein the size of the metal particles in the snowflake-shaped metal layer is 1.5-10 nm, and the thickness of the snowflake-shaped metal layer is 0.1-2 mm;
c) Attaching a fastening layer, wherein the size of the metal particles in the fastening layer is 0.5-1.5 nm, and the thickness of the fastening layer is 1-5 nm;

Step 4: washing the metal substrate that is attached with a metal layer; specifically, placing the metal substrate into a washing tank containing 5 wt % of sodium carbonate;

subsequently, heating the liquid in the washing tank to a temperature of 40-60° C. via ultrasonic wave, washing the metal substrate for 10-15 minutes, and then washing the metal substrate by clean water for two to three times;

Step 5: absorbing the liquid left on the metal substrate that is washed in step 4; subsequently, drying the metal substrate, thereby obtaining the copper powder metal plating layer having a liquid-absorbing capillary force; specifically, absorbing the residual water in the metal layer of the cleaned metal substrate by absorbent paper; subsequently, placing the metal substrate into a nitrogen protection box for a drying process, thereby obtaining the copper powder metal plating layer having a water-absorbing capillary force, and preventing the metal plating layer from being oxidized.

In the preparation process of the copper powder metal plating layer of the present invention, step 3 (attaching the metal layer) is a crucial step. During the process of attaching the bottom layer, the current is controlled at 0.8-1.1 A, and the attachment time is 10-15 minutes; during the process of attaching the snowflake-shaped metal layer, the current is controlled within the range of 1.5-8.0 A, and the attachment time is 2-10 minutes; according to the area of the surface, the current in the process of attaching the fastening layer is controlled within the range of 0.3-1.0 A, and the attachment time is 1-2 hours; according to the requirement, the bottom layer, the snowflake-shaped metal layer and the fastening layer are respectively to be a single-layered structure or a multi-layered structure.

Figure 1:
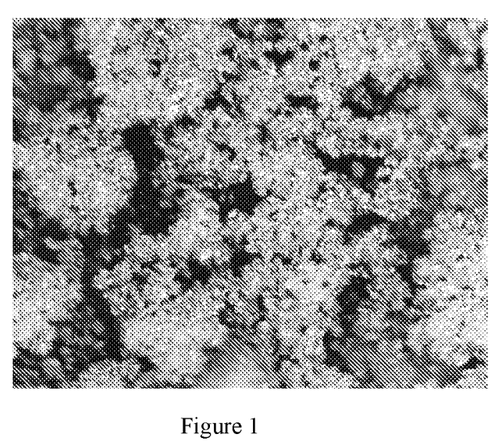
FIG. 1 is a schematic diagram illustrating the microstructure (magnified by 500 times) of the copper powder metal plating layer of the present invention.
Figure 2:
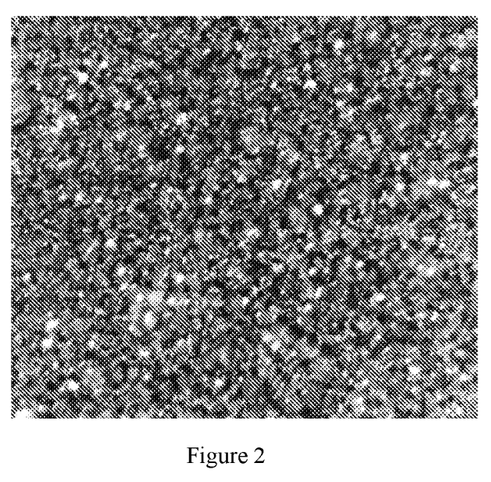
FIG. 2 is a schematic diagram illustrating the microstructure (magnified by 500 times) of the copper powder metal plating layer of the prior art.

The preparation process of the copper powder metal plating layer of the present invention adopts an electroplating method to turn metal atoms into snowflake-shaped metal layers. The metal layer comprises at least three depositing layers, and preferably 4-5 depositing layers. The small metal particles are deposited in the bottom layer, which can be effectively combined with the metal substrate. The size of the metal particles in the snowflake-shaped metal layer is larger than that of the metal particles in the bottom layer. The fastening layer is used for effectively combining the snowflake-shaped metal layer and the metal substrate, thereby achieving a greater capillary force of the whole metal layer. The microstructure of the copper powder metal plating layer of the present invention is shown in FIG. 1. Compared with the porous structure of the prior copper powder metal plating layer shown in FIG. 2, the copper powder metal plating layer of the present invention is a snowflake-shaped layer structure or a coral-shaped layer structure. By means of the multi-layered structure, the firmness of the copper powder metal plating layer can be greatly improved, and cannot be peeled off unless there's a mechanical damage.

The microstructure of the copper powder metal plating layer of the present invention shows a small-particle multi-layered structure, and is in a snowflake shape or a coral shape in overall. The descriptions such as snowflake-shaped or coral-shaped can be correspondingly adjusted or changed.

The preparation process of the copper powder metal plating layer adopts a DC electroplating method, and the DC current is not higher than 10 A. The temperature of the electroplating liquid is not higher than 10° C. A high temperature can lead to a high activity of copper ions, resulting in a difficult attachment process. Meanwhile, the copper powder can be over-burnt, blackened and oxidized under a large current. Due to the DC current adopted in the preparation process, the rigidity of the metal substrate can be protected from being damaged. Thus, the hardness of the metal substrate can be perfectly kept. During a traditional high-temperature sintering process, the metal substrate can be softened and deformed, resulting in a poor anti-burst performance in later use. By means of the present invention, the technical problems of the prior art can be solved.

The traditional copper powder metal plating layer can only be prepared after being sintered in a vacuum furnace for 8 hours at a temperature higher than 800° C., and then soldered at a temperature of 950° C. for 3-4 hours. Such a process is power-consuming and time-consuming. Even worse, the copper material can be softened during the high temperature sintering process, resulting in the deformation in later use. Compared with the prior art, the preparation process of the copper powder metal plating layer adopts DC current, and the metal plating layer can be prepared within three hours. The electroplating process of each metal substrate merely consumes 1 kilowatt-hour. Thus, the preparation time can be shortened, the energy consumption can be reduced and the environment can be protected.

In the preparation process of the copper powder metal plating layer of the present invention, the electroplating materials only includes copper blocks, sulfuric acid, copper sulfate solution and purified water, and the whole preparation process merely consumes copper blocks and copper ions. Compared with the prior art, it's unnecessary to replace the copper sulfate solution except for supplementing copper ions. The concentration of the copper sulfate solution can be adjusted by adding purified water, effectively preventing byproducts from being generated. Thus, the preparation process of the present invention is cost-effective and eco-friendly.

Embodiment 2

The preparation process of the copper powder metal plating layer of embodiment 2 is similar to that of embodiment 1. The difference between the two embodiments is: in the preparation process of the copper powder metal plating layer of embodiment 2, the current in the process of attaching the snowflake-shaped metal layer is controlled at 2.0 A, the attachment time is 2 minutes, and the thickness of the prepared copper powder metal plating layer is 0.1 mm.

According to the above, a higher capillary performance of the copper powder metal plating layer can be achieved, meaning that 1 ml water can be completely absorbed within 0.05 second.

The preparation process of the copper powder metal plating layer is energy-efficient and eco-friendly. The copper powder metal plating layer can be firmly attached to the metal substrate. The copper powder metal plating layer prepared by the process of the present invention shows a snowflake-shaped layer structure, which has a larger surface area, a higher evaporation speed, a greater capillary force and a thinner thickness. The preparation process of the present invention can protect the rigidity of the metal substrate from being damaged, ensuring an ideal hardness of the metal substrate. In order to obtain copper powder metal plating layers with different thicknesses, the preparation process of the copper powder metal plating layer can be various. Tests show that the following processes can achieve a higher performance of the copper powder metal plating layer having a corresponding thickness:

Regulating the current to be 1.5 A; after attaching for 2 minutes, obtaining the snowflake-shaped metal layer having a thickness of 0.1 mm; alternatively, Regulating the current to be 2.5 A; after attaching for 2 minutes, obtaining the snowflake-shaped metal layer having a thickness of 0.15-0.2 mm; alternatively, Regulating the current to be 3.0 A; after attaching for 2.5 minutes, obtaining the snowflake-shaped metal layer having a thickness of 0.25-0.3 mm; alternatively, Regulating the current to be 4.0 A; after attaching for 3 minutes, obtaining the snowflake-shaped metal layer having a thickness of 0.35 mm; alternatively, Regulating the current to be 4.5-5.0 A; after attaching for 3 minutes, obtaining the snowflake-shaped metal layer having a thickness of 0.4 mm; alternatively, Regulating the current to be 5.5 A; after attaching for 4 minutes, obtaining the snowflake-shaped metal layer having a thickness of 0.5 mm; alternatively, Regulating the current to be 6 A; after attaching for 5 minutes, obtaining the snowflake-shaped metal layer having a thickness of 0.6 mm; alternatively, Regulating the current to be 6.5 A; after attaching for 5 minutes, obtaining the snowflake-shaped metal layer having a thickness of 0.7-0.8 mm; alternatively, Regulating the current to be 7.0 A; after attaching for 6 minutes, obtaining the snowflake-shaped metal layer having a thickness of 0.9 mm; alternatively, Regulating the current to be 8.0 A; after attaching for 6 minutes, obtaining the snowflake-shaped metal layer having a thickness of 1 mm.

According to the above, a higher capillary performance of the copper powder metal plating layer can be achieved, and 1 ml water can be completely absorbed within 0.01-0.05 second. The copper powder metal plating layer prepared by the process of the present invention shows a snowflake-shaped multi-layer structure, which has a larger surface area, a higher evaporation speed, a greater capillary force and a thinner thickness. The preparation process of the present invention can protect the rigidity of the metal substrate from being damaged, ensuring an ideal hardness of the metal substrate.

Embodiment 3

A process for preparing the energy-saving anti-burst heat dissipation device, comprising the steps of:

Step 1: respectively electroplating the copper powder metal plating layer onto an upper metal substrate and a lower metal substrate according to the preparation process of embodiment 1 or 2;

Step 2: seal-soldering the periphery of the upper metal substrate and the lower metal substrate that are electroplated with the copper powder metal plating layer via a laser soldering method, thereby forming a sealed chamber;

Step 3: utilizing a high-frequency soldering degasser 600 to obtain a vapor chamber, and feeding refrigerant into the vapor chamber through the degasser;

Step 4: vacuuming the chamber for the first time, thereby enabling the air pressure in the chamber to reach $6.0^{-1}$ to $8.0^{-2}$ Pa;

Step 5: degassing for the second time, and heating the vacuumed vapor chamber to a temperature of 100-150° C. (preferably 120° C.), thereby forcing the residual gas in step 4 to be concentrated at the top of the degasser, and then cutting-off the degasser from the tail end;

Step 6: seal-soldering the cut; preferably, adopting a laser soldering method to seal-solder the cut;

Step 7: shaping and trimming, thereby obtaining a finished heat dissipation device; specifically, after being trimmed and grinded, a finished heat dissipation device can be achieved.

Figure 3:
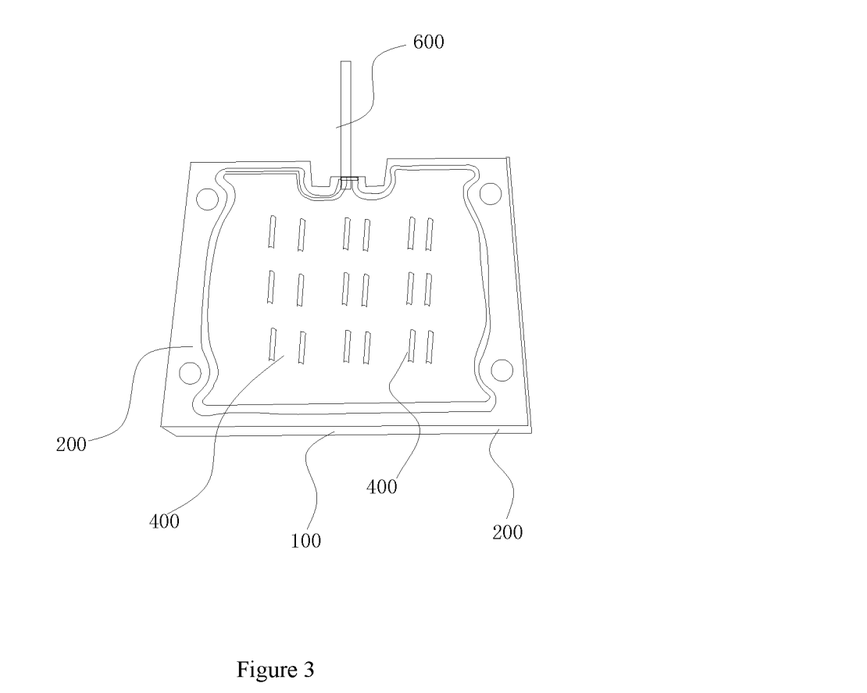
FIG. 3 is a structural diagram of the energy-saving anti-burst heat dissipation device of the present invention.

FIG. 3 shows an overall structure of the energy-saving anti-burst heat dissipation device of the present invention. As shown in FIG. 3, the energy-saving anti-burst heat dissipation device comprises an upper substrate 100 and a lower substrate 200. The inner surface of the upper substrate 100 is attached with a metal plating layer 500, and the inner surface of the lower substrate 200 is attached with a metal plating layer 500. The chamber formed by the upper substrate 100 and the lower substrate 200 is filled with refrigerant. The refrigerant can be water, ethyl alcohol, acetone, R12 or Freon, etc.

The copper power metal layer comprises a bottom layer that is attached to the inner surface of the upper substrate or the lower substrate, a snowflake-shaped metal layer that is attached on the bottom layer, and a fastening layer that is attached on the snowflake-shaped metal layer. The size of the metal particles in the bottom layer is 0.1-1 nm, and the thickness of the bottom layer is 0.01-0.05 mm. The size of the metal particles in the snowflake-shaped metal layer is 1.5-10 nm, and the thickness of the snowflake-shaped metal layer is 0.1-2 mm. The size of the metal particles in the fastening layer is 0.5-1.5 nm, and the thickness of the fastening layer is 1-5 nm.

The small metal particles are deposited in the bottom layer, which can be effectively combined with the metal substrate. The size of the metal particles in the snowflake-shaped metal layer is larger than that of the metal particles in the bottom layer. The fastening layer is used for effectively combining the snowflake-shaped metal layer and the metal substrate, thereby achieving a greater capillary force of the whole metal layer. The copper powder metal plating layer of the present invention shows a snowflake-shaped layer structure or a coral-shaped layer structure. By means of the multi-layered structure, the firmness of the copper powder metal plating layer can be greatly improved. It's difficult to peel off the copper powder metal plating layer unless being damaged by a mechanical force. The prepared energy-saving anti-burst heat dissipation device achieves ideal heat conduction, heat dissipation, and anti-burst performance.

When the energy-saving anti-burst heat dissipation device of the present invention is in an off-state, the copper powder metal plating layers of the upper substrate 100 and the lower substrate 200 are in a saturation condition after absorbing enough refrigerant. During work, when one surface of the upper substrate 100 or the lower substrate 200 is in contact with a heat source, for instance, when the lower substrate 200 is in contact with the heat source, the lower substrate 200 is heated, and the refrigerant absorbed in the copper powder metal plating layer 500 starts to evaporate and rise. The water vapor that reaches the upper substrate 100 is cooled and condensed into liquid drops. Due to the refrigerant absorbed in the copper power metal plating layer of the upper substrate 100, the water vapor instantaneously exchanges heat to become liquid drops within one second, and the liquid drops return to the lower substrate 200. Thus, by means of the energy-saving anti-burst heat dissipation device of the present invention, second-level heat dissipation efficiency and ideal heat dissipation effect can be achieved.

The copper powder metal plating layers 500 of the upper substrate 100 and the lower substrate 200 of the energy-saving anti-burst heat dissipation device can reach a thickness of about 0.1 mm. Thus, the technical requirement of the energy-saving anti-burst heat dissipation device that needs an overall thickness of 0.3 mm can be satisfied. Meanwhile, the present invention breaks the technical bottleneck of 0.6 mm in the prior art, allowing the heat dissipation devices to be widely used in highly-integrated electronic products.

The preparation process of the copper powder metal plating layer 500 that is attached to the upper substrate 100 or the lower substrate 200 is energy-efficient and eco-friendly. The copper powder metal plating layer 500 can be firmly attached to the metal substrates. The copper powder metal plating layer prepared by the process of the present invention has a larger surface area, a higher evaporation speed and a greater capillary force. Due to the DC current adopted in the preparation process, the rigidity of the metal substrate can be protected from being damaged. Thus, the hardness of the metal substrate can be perfectly kept.

Embodiment 4

Figure 4:
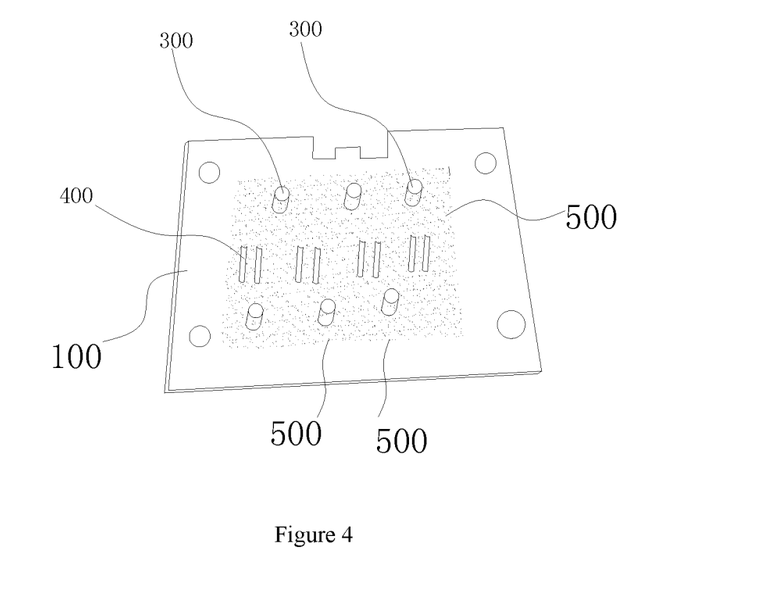
FIG. 4 is a structural diagram of the upper substrate of the energy-saving anti-burst heat dissipation device of embodiment 4 of the present invention.
Figure 5:
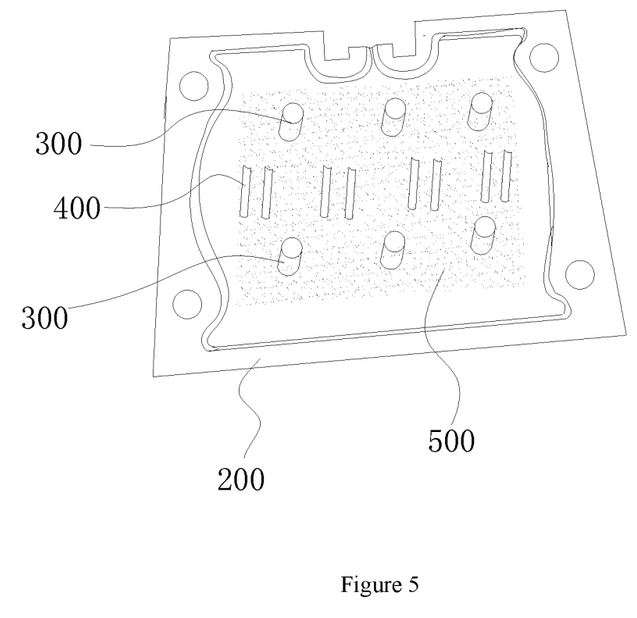
FIG. 5 is a structural diagram of the lower substrate of the energy-saving anti-burst heat dissipation device of embodiment 4 of the present invention.

The energy-saving anti-burst heat dissipation device is prepared by the process of embodiment 3. The technical features of embodiment 4 are same as that of the embodiment 3 except for the following:

As shown in FIGS. 4-5, the anti-burst heat dissipation device comprises an upper substrate 100 and a lower substrate 200. As shown in FIG. 4, a plurality of column bodies 300 is disposed on the inner surface of the upper substrate 100. The inner surface of the upper substrate 100 is provided with a plurality of compression-molded supporting ribs 400. The inner surface of the upper substrate 100, the surface of the column body 300 and the surface of the supporting rib 400 are respectively attached with a copper powder metal plating layer 500. As shown in FIG. 5, a plurality of column bodies 300 is disposed on the inner surface of the lower substrate 200. The inner surface of the lower substrate 200 is provided with a plurality of supporting ribs 400. The inner surface of the lower substrate 200, the surface of the column body 300 and the surface of the supporting rib 400 are respectively attached with a copper powder metal plating layer 500.

The upper substrate 100 is assembled to the lower substrate 200, and is seal-soldered to the lower substrate 200 via a laser soldering method or a friction soldering method, thereby forming a sealed chamber. Preferably, the inner surface of the upper substrate 100 is soldered with one ends of the column bodies 300, and the other ends of the column bodies 300 that are soldered to the upper substrate 100 abut against the inner surface of the lower substrate 200. The column bodies 300 of the upper substrate 100 and the lower substrate 200 are disposed in a staggered manner, and abut against the corresponding inner surface of the lower substrate 200 or the upper substrate 100.

By means of the supporting ribs 400, the supporting strength between the upper substrate 100 and the lower substrate 200 can be improved, preventing the chamber formed by the upper substrate 100 and the lower substrate 200 from bursting.

The column bodies can further improve the supporting strength between the upper substrate 100 and the lower substrate 200, achieving a higher overall mechanical performance of the heat dissipation device. Thus, the chamber formed between the upper substrate 100 and the lower substrate 200 can be protected from bursting.

Tests show that the burst-rate of the heat dissipation device that is simultaneously provided with supporting ribs and column bodies of the present invention is far lower than that of the traditional heat dissipation device that is merely provided with supporting ribs 400. After detecting the anti-burst performance of 1000 samples that are provided with the supporting ribs 400 and the column bodies, the burst-rate is only one ten-thousandth.

Furthermore, the supporting ribs 400 and the column bodies 300 are provided with drainage paths for allowing the condensed liquid drops to flow back along the column bodies 300 and the supporting ribs 400.

Figure 6:
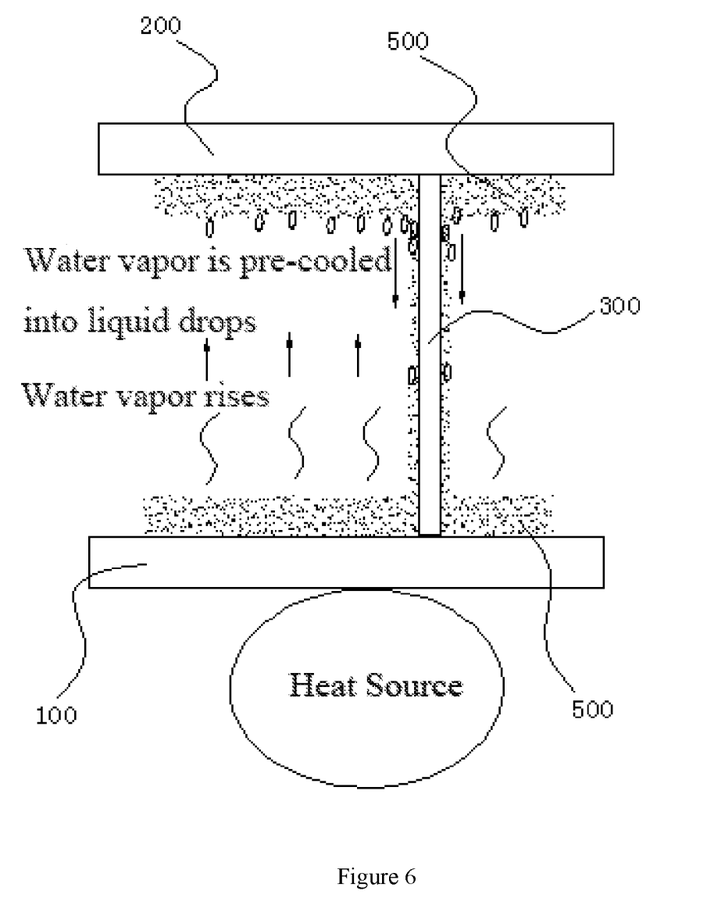
FIG. 6 is a schematic diagram explaining the operating principle of the energy-saving anti-burst heat dissipation device of embodiment 4 of the present invention.

The supporting ribs 400 and the column bodies are plated with the copper powder metal plating layer 500. During the evaporation process, a part of the water vapor is cooled and condensed into liquid drops when encountering the copper powder metal plating layer 500 of the column bodies, and then flow back along the column bodies. Likewise, a part of the water vapor is condensed into liquid drops when encountering the copper powder metal plating layer of the supporting ribs 400, and then flow back along the supporting ribs 400. As shown in FIG. 6, the supporting ribs 400, the column bodies and the copper powder metal plating layer 500 interact to realize a radiation-type evaporation reflow circulation process. Thus, a higher heat dissipation performance of the present invention can be achieved.

The operating principle of the energy-saving anti-burst heat dissipation device of the present invention is the following:

When the energy-saving anti-burst heat dissipation device is not in a heated state, namely, in an off-state, the copper powder metal plating layers 500 of the upper substrate 100 and the lower substrate 200 absorb enough refrigerant to reach a saturation condition. During work, when any surface of the upper substrate 100 or the lower substrate 200 is in contact with a heat source, for instance, when the upper substrate 100 is in contact with the heat source, the upper substrate 100 is heated by the heat source, and the refrigerant absorbed in the copper powder metal plating layer 500 starts to evaporate and rise. A part of the water vapor that reaches the lower substrate 200 is cooled and condensed into liquid drops, and the other part of the water vapor that encounters the copper powder metal plating layer 500 of the column bodies or the supporting ribs 400 is cooled and condensed into liquid drops, and then flow back to the upper substrate 100 along the column bodies or the supporting ribs 400, thereby achieving a heat dissipation circulation between the upper substrate 100 and the lower substrate 200. The heat dissipation process of the present invention can be completed within few seconds. As shown in FIG. 6, the anti-burst heat dissipation device can achieve higher evaporation speed and heat dissipation performance through the copper powder metal plating layer provided on the upper substrate 100 and the lower substrate 200.

Furthermore, the metal substrate can be a copper substrate, an aluminum substrate, a zinc substrate, a tin substrate, a titanium substrate or a stainless-steel substrate, etc.

The structure of the energy-saving anti-burst heat dissipation device is not limited by the embodiments. The copper powder metal plating layer 500 can be plated on any metal substrate. Meanwhile, the column bodies and the supporting ribs 400 are preferably disposed on both the upper substrate 100 and the lower substrate 200, or disposed on one substrate.

The preparation process of the copper powder metal plating layer 500 that is attached to the upper substrate 100 or the lower substrate 200 is energy-efficient and eco-friendly. The copper powder metal plating layer 500 can be firmly attached to the metal substrates. The copper powder metal plating layer prepared by the process of the present invention has a larger surface area, a higher evaporation speed and a greater capillary force. As the preparation process of the present invention adopts DC current, the rigidity of the metal substrate can be protected from being damaged. Thus, the hardness of the metal substrate can be perfectly kept. The prepared heat dissipation device of the present invention possesses a high anti-burst performance and achieves quick heat conduction and heat dissipation.

Embodiment 5

The energy-saving anti-burst heat dissipation device is prepared by the process of embodiment 3. The technical features of embodiment 5 are same as that of the embodiment 4 except for the following:

The plurality of column bodies 300 is merely disposed on the upper substrate 100. The inner surfaces of the upper substrate 100 and the lower substrate 200 are respectively provided with a plurality of compression-molded supporting ribs 400. The prepared heat dissipation device possesses a high anti-burst performance and achieves quick heat conduction and heat dissipation.

Embodiment 6

The energy-saving anti-burst heat dissipation device is prepared by the process of embodiment 3. The technical features of embodiment 6 are same as that of the embodiment 4 except for the following:

The plurality of column bodies 300 is merely disposed on the lower substrate 200. The inner surfaces of the upper substrate 100 and the lower substrate 200 are respectively provided with a plurality of compression-molded supporting ribs 400. The prepared heat dissipation device possesses a high anti-burst performance and achieves quick heat conduction and heat dissipation.

Embodiment 7

The structure of the energy-saving anti-burst heat dissipation device is same as that of embodiment 3. The difference between them is the following:

The copper powder metal plating layer is further provided with a reinforcement layer and a locking layer. The reinforcement layer is attached on the fastening layer. The size of the metal particles in the reinforcement layer is 0.5-2.0 nm, and the thickness of the fastening layer is 1-5 nm. The locking layer is attached on the reinforcement layer. The size of the metal particles in the locking layer is 0.8-1.5 nm, and the thickness of the fastening layer is 1-5 nm.

Through the reinforcement layer and the locking layer, the attachment force between the copper powder metal plating layer and the metal substrate can be greatly improved, and the capillary force of the whole copper powder metal plating layer can be enhanced.

Tests show that the peeling-off force borne by the copper powder metal plating layer having a reinforcement layer and a locking layer is 60% higher than that borne by the copper powder metal plating layer having no reinforcement layer and locking layer. Meanwhile, the capillary force of the copper powder metal plating layer having a reinforcement layer and a locking layer can be greatly improved.

The description of above embodiments allows those skilled in the art to realize or use the present invention. Without departing from the spirit and essence of the present invention, those skilled in the art can combine, change or modify correspondingly according to the present invention. Therefore, the protective range of the present invention should not be limited to the embodiments above but conform to the widest protective range which is consistent with the principles and innovative characteristics of the present invention. Although some special terms are used in the description of the present invention, the scope of the invention should not necessarily be limited by this description. The scope of the present invention is defined by the claims.

The invention claimed is:

1. A process for preparing an energy-saving anti-burst heat dissipation device, comprising the steps of:
    Step 1: respectively electroplating a copper powder metal plating layer onto an upper metal substrate and a lower metal substrate;
    Step 2: seal-soldering a periphery of the upper metal substrate and the lower metal substrate that are electroplated with the copper powder metal plating layer via a laser soldering method, thereby forming a sealed chamber;
    Step 3: feeding refrigerant into the vapor chamber through a degasser;
    Step 4: applying a vacuum to the vapor chamber such that the pressure in the vapor chamber reaches $6.0^{-1}$ to $8.0^{-2}$ Pa;
    Step 5: repeating step 4 while heating the vapor chamber to a temperature of 100-150° C., thereby forcing any residual gas in in the vapor chamber to be concentrated in a portion of the degasser; and subsequently, removing the portion of the degasser containing the residual gas;
    Step 6: seal-soldering the vapor chamber at the cut formed to remove the portion of the vapor chamber;
    Step 7: shaping and trimming the vapor chamber, thereby obtaining a finished heat dissipation device.

2. The process for preparing the energy-saving anti-burst heat dissipation device of claim 1, wherein at least one of the upper metal substrate and the lower metal substrate is provided with a plurality of column bodies, and the plurality of column bodies is soldered to the metal substrate on which the column bodies are provided, wherein at least one of the upper metal substrate and the lower metal substrate is provided with a plurality of supporting ribs, and the plurality of supporting ribs is molded in one body with the metal substrate on which the supporting ribs are provided, wherein exposed surfaces of the column bodies and the supporting ribs are attached with the copper powder metal plating layer, and the copper powder metal plating layer functions as a refrigerant conductor, wherein when the upper metal substrate and the lower metal substrate are joined to each other, the end portion of the column bodies that are disposed on one metal substrate abut against the other metal substrate, and the supporting ribs that are disposed on one metal substrate abut against the other metal substrate.

3. The process for preparing the energy-saving anti-burst heat dissipation device of claim 2, wherein the upper and lower metal substrates are a copper substrate, an aluminum substrate, a zinc substrate, a tin substrate, a titanium substrate or a stainless-steel substrate, wherein the plurality of column bodies is soldered to the upper or lower metal substrate via a laser soldering method or a friction soldering method, wherein Step 5 comprises heating the vapor chamber to 120° C.,
wherein Step 6 comprises seal-soldering the cut via a laser soldering method, and
wherein Step 7 comprises trimming and grinding.

* * * * *